(12) United States Patent
Wang et al.

(10) Patent No.: US 8,946,834 B2
(45) Date of Patent: Feb. 3, 2015

(54) HIGH THERMAL STABILITY FREE LAYER WITH HIGH OUT-OF-PLANE ANISOTROPY FOR MAGNETIC DEVICE APPLICATIONS

(75) Inventors: Yu-Jen Wang, San Jose, CA (US); Witold Kula, Sunnyvale, CA (US); Guenole Jan, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/409,456

(22) Filed: Mar. 1, 2012

(65) Prior Publication Data

US 2013/0230741 A1    Sep. 5, 2013

(51) Int. Cl.
| | |
|---|---|
| G11C 11/14 | (2006.01) |
| H01L 43/08 | (2006.01) |
| G11C 11/02 | (2006.01) |
| H01F 10/32 | (2006.01) |
| G01R 33/09 | (2006.01) |

(52) U.S. Cl.
CPC .......... *G01R 33/098* (2013.01); *H01F 10/3231* (2013.01)
USPC ........ 257/421; 365/158; 365/171; 428/811.1; 428/811.5

(58) Field of Classification Search
None
See application file for complete search history.

(56) References Cited

U.S. PATENT DOCUMENTS

| | | | |
|---|---|---|---|
| 8,008,740 B2 | 8/2011 | Zhao et al. | |
| 8,018,759 B2 | 9/2011 | Kano et al. | |
| 8,026,562 B2 | 9/2011 | Chen et al. | |
| 8,279,666 B2 * | 10/2012 | Dieny et al. | .................... 365/171 |
| 2005/0259365 A1 | 11/2005 | Singleton et al. | |
| 2007/0242502 A1 * | 10/2007 | Hosomi et al. | ................ 365/158 |
| 2008/0007994 A1 | 1/2008 | Guo | |
| 2008/0094886 A1 | 4/2008 | Ranjan et al. | |
| 2008/0253174 A1 | 10/2008 | Yoshikawa et al. | |
| 2009/0161267 A1 | 6/2009 | Kawai et al. | |
| 2010/0261295 A1 * | 10/2010 | Horng et al. | ...................... 438/3 |
| 2011/0141804 A1 | 6/2011 | Apalkov et al. | |
| 2011/0188157 A1 | 8/2011 | Zhao et al. | |
| 2011/0222335 A1 * | 9/2011 | Yoshikawa et al. | ........... 365/158 |
| 2011/0233700 A1 * | 9/2011 | Hayakawa et al. | ........... 257/421 |

(Continued)

OTHER PUBLICATIONS

"Current-induced magnetization reversal in nanopillars with perpendicular anisotropy," by S. Mangin et al., nature materials, vol. 5, Mar. 2006, www.nature.com/naturematerials, pp. 210-215.

(Continued)

*Primary Examiner* — Kevin Bernatz
(74) *Attorney, Agent, or Firm* — Saile Ackerman LLC; Stephen B. Ackerman

(57) ABSTRACT

A CoFeB or CoFeNiB magnetic layer wherein the boron content is 25 to 40 atomic % and with a thickness <20 Angstroms is used to achieve high perpendicular magnetic anisotropy and enhanced thermal stability in magnetic devices. A dusting layer made of Co, Ni, Fe or alloy thereof is added to top and bottom surfaces of the CoFeB layer to increase magnetoresistance as well as improve Hc and Hk. Another embodiment includes a non-magnetic metal insertion in the CoFeB free layer. The CoFeB layer with elevated B content may be incorporated as a free layer, dipole layer, or reference layer in STT-MRAM memory elements or in spintronic devices including a spin transfer oscillator. Thermal stability is increased such that substantial Hk is retained after annealing to at least 400° C. for 1 hour. Ku enhancement is achieved and the retention time of a memory cell for STT-MRAM designs is increased.

22 Claims, 3 Drawing Sheets

(56) References Cited

U.S. PATENT DOCUMENTS

| | | | |
|---|---|---|---|
| 2011/0279921 A1 | 11/2011 | Zhang et al. | |
| 2012/0063218 A1* | 3/2012 | Huai et al. | 365/171 |
| 2012/0241878 A1* | 9/2012 | Hu et al. | 257/421 |
| 2012/0250404 A1* | 10/2012 | Wang et al. | 365/171 |
| 2013/0119498 A1* | 5/2013 | Huai et al. | 257/421 |
| 2013/0154038 A1* | 6/2013 | Horng et al. | 257/421 |
| 2013/0221460 A1* | 8/2013 | Jan et al. | 257/421 |
| 2014/0035074 A1* | 2/2014 | Jan et al. | 257/421 |

OTHER PUBLICATIONS

"Microwave Assisted Magnetic Recording," by Jian-Gang, Zhu et al., IEEE Transactions on Magnetics, vol. 44, No. 1, Jan. 2008, pp. 125-131.

"Current-driven excitation of magnetic multilayers," by J.C. Slonczewski, Journal of Magnetism and Magnetic Materials 159 (1996) L1-L7, Elsevier.

"A perpendicular-anisotropy CoFeB-MgO magnetic tunnel junction," by S. Ikeda et al., nature materials Letters, Published online: Jul. 11, 2010, DOI: 10.1038/NMAT2804, www.nature.com/naturematerials, pp. 1-4.

Co-pending. US Patent HMG11-012, U.S. Appl. No. 13/406,972, filed Feb. 28, 2012, "High Thermal Stability Reference Structure with Out-of-Plane Anisotropy for Magnetic Device Applications," assigned to the same assignee as the present invention, 36 pgs.

Co-pending US Patent HMG10-038, U.S. Appl. No. 12/931,866, filed Feb. 11, 2011, "Magnetic Element with Improved Out-of-Plane Anisotropy for Spintronic Applications," assigned to the same assignee as the present invention, 36 pgs.

PCT Search Report, PCT/US 13/27937, Mailed—May 6, 2013, Headway Technologies, Inc.

\* cited by examiner

HIGH THERMAL STABILITY FREE LAYER WITH HIGH OUT-OF-PLANE ANISOTROPY FOR MAGNETIC DEVICE APPLICATIONS

RELATED PATENT APPLICATION

This application is related to the following: Ser. No. 12/931,866, filing date Feb. 11, 2011; and Ser. No. 13/406,972, filing date Feb. 28, 2012; both assigned to a common assignee and herein incorporated by reference in their entirety.

TECHNICAL FIELD

This disclosure relates to a magnetic devices that utilize thin films with perpendicular magnetic anisotropy (PMA) and a method for making the same, and in particular, to increasing Hc and thermal stability in the resulting multilayer magnetic stack to survive high temperature semiconductor processes up to 400° C.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry. The STO comprises a stack including a spin injection layer (SIL) with PMA character, an oscillating field generation layer (FGL) with in-plane anisotropy, and a spacer between the SIL and FGL.

Both MRAM and STT-MRAM may have a MTJ element based on a tunneling magneto-resistance (TMR) effect wherein a stack of layers has a configuration in which two ferromagnetic layers typically referred to as a reference layer and free layer are separated by a thin non-magnetic dielectric layer. The MTJ element is typically formed between a bottom electrode such as a first conductive line and a top electrode which is a second conductive line at locations where the top electrode crosses over the bottom electrode in a MRAM device. In another aspect, a MTJ element in a read head sensor may be based on a giant magnetoresistance (GMR) effect that relates to a spin valve structure where a reference layer and free layer are separated by a metal spacer. In sensor structures, the MTJ is formed between two shields and there is a hard bias layer adjacent to the MTJ element to provide longitudinal biasing for stabilizing the free layer magnetization.

A high performance MRAM MTJ element is characterized by a high tunneling magnetoresistive (TMR) ratio which is dR/R where R is the minimum resistance observed of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-MRAM (STT-MRAM), a high $\lambda_S$ and high Hc leads to high anisotropy for greater thermal stability.

When a memory element uses a free layer with a magnetic moment lying in the plane of the film, the current needed to change the magnetic orientation of a magnetic region is proportional to the net polarization of the current, the volume, magnetization, Gilbert damping constant, and anisotropy field of the magnetic region to be affected. The critical current ($i_C$) required to perform such a change in magnetization is given in equation (1):

$$i_c = \frac{\alpha e V M s}{g\hbar}\left[H_{k_{\text{eff}},\parallel} + \frac{1}{2}H_{k_{\text{eff}},\perp}\right] \quad (1)$$

where e is the electron charge, $\alpha$ is a Gilbert damping constant, Ms is the saturation magnetization of the free layer, h is the reduced Plank's constant, g is the gyromagnetic ratio, $H_{k_{\text{eff}}\parallel}$ is the in-plane anisotropy field, and $H_{k_{\text{eff}}\perp}$ is the out-of-plane anisotropy field of the magnetic region to switch, and V is the volume of the free layer. For most applications, the spin polarized current must be as small as possible.

The value $\Delta = kV/k_B T$ is a measure of the thermal stability of the magnetic element. If the magnetization lies in-plane, the value can be expressed as shown in equation (2):

$$\Delta = \frac{M_S V H_{k_{\text{eff}},\parallel}}{2k_B T} \quad (2)$$

where $k_B$ is the Boltzmann constant and T is the temperature.

Unfortunately, to attain thermal stability of the magnetic region, a large net magnetization is required which in most cases would increase the spin polarized current necessary to change the orientation of the magnetic region.

When the free layer has a magnetization direction perpendicular to the plane of the film, the critical current needed to switch the magnetic element is directly proportional to the perpendicular anisotropy field as indicated in equation (3):

$$i_c = \frac{\alpha e M s V H_{k_{\text{eff}},\perp}}{g\hbar} \quad (3)$$

The parameters in equation (3) were previously explained with regard to equation (1).

Thermal stability is a function of the perpendicular anisotropy field as shown in equation (4):

$$\Delta = \frac{M_S V H_{k_{\text{eff}},\perp}}{2k_B T} \quad (4)$$

In both in-plane and out-of-plane configurations, the perpendicular anisotropy field of the magnetic element is expressed in equation (5) as:

$$H_{k_{\text{eff}},\perp} = -4\pi M_s + \frac{2K_U^{+,s}}{M_s d} + H_{k,\chi,\perp} \quad (5)$$

where $M_s$ is the saturation magnetization, d is the thickness of the magnetic element, $H_{k,\chi,\perp}$ is the crystalline anisotropy field in the perpendicular direction, and $K_U^{\perp,s}$ is the surface perpendicular anisotropy of the top and bottom surfaces of the magnetic element. In the absence of strong crystalline anisotropy, the perpendicular anisotropy field of a magnetic layer is dominated by the shape anisotropy field ($-4\pi M_s$) on which little control is available. At a given thickness, lower magnetization saturation decreases shape anisotropy and the spin-polarized switching current but also decreases thermal stability which is not desirable. Therefore, an improved configuration for a magnetic element is needed that provides improved thermal stability for a free layer with perpendicular magnetic anisotropy.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Magnin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability. Even as magnetic tunnel junctions (MTJs) lower the switching current by minimizing the demagnetization term, they provide a high energy barrier (Eb) due to the large perpendicular anisotropy maintained at small (<100 nm) junctions. Out of plane magnetic anisotropy begins to degenerate at annealing temperatures greater than about 350° C. and current thin films completely lose PMA character after 400° C. annealing processes. Thus, there is a significant challenge to increase PMA and enhance thermal stability of free layers to improve the performance of MTJs at elevated temperatures typical of back end of line (BEOL) semiconductor processes. Current technology fails to provide high Hc and thermal stability in a free layer with PMA character that will withstand high temperature processing up to at least 400° C. which is required in semiconductor fabrication methods. Therefore, an improved MTJ stack with a high thermally stable free layer that exhibits PMA is needed for magnetic device applications.

SUMMARY

One objective of the present disclosure is to provide a MTJ stack in a magnetic device that has a free layer with PMA that is thermally stable to annealing and other high temperature processes up to at least 400° C., and with a high magnetoresistance and thermal stability factor ($\Delta$) that is suitable for spintronic applications such as spin-torque MRAM (STT-MRAM), and microwave assisted magnetic recording (MAMR).

A second objective of the present disclosure is to provide a MTJ stack of layers with a material set that is compatible with the design and processing requirements of magnetic devices.

According to one embodiment of the present disclosure, these objectives are achieved with a magnetic tunnel junction (MTJ) configuration comprising at least a reference (pinned layer), a free layer containing at least a layer with a $Co_R Fe_S Ni_W B_T$ composition where R, S, W, and T are the content of Co, Fe, Ni, and B, respectively, R+S+W+T=100, S>(R+W), W is from 0 to 2 atomic %, and T is from 25 to 40 atomic %, a tunnel barrier formed between the reference and free layers, and a cap layer formed on a top surface of the free layer in a bottom spin valve configuration. Additional layers may be included such as a seed layer at the bottom layer of the MTJ stack. The seed layer may be NiCr, Pd, Pt, Ta, Ru, or other materials that maintain or enhance PMA in an overlying reference layer. A key feature is the thickness of the free layer should be less than about 20 Angstroms thick to enable perpendicular magnetic anisotropy (PMA) in the $Co_R Fe_S Ni_W B_T$ layer. In one aspect, the reference layer also has PMA character and may be made of $(Co/Ni)_n$ laminates or the like, $L1_0$ ordered alloys such as FePt, CoPt, FePd, NiPt, FeNi, FeCu, MnAl, MnPt, MnPd, CuAu, or rare earth-transition metal (RE-TM) films including TbFeCo and GdFeCo. The tunnel barrier may be any oxide layer such as MgO, $Al_2O_3$, TiOx, or HfOx that induces a spin dependent tunneling effect between the free layer and reference layer. The capping layer is a metal layer or a metal oxide that induces or enhances out-of-plane anisotropy in the free layer.

According to one bottom spin valve scheme, there may be a dusting layer formed on the top surface of the free layer. The dusting layer may be Fe, Co, Ni, or an alloy thereof such as NiFe, CoFe, CoB, or FeB with a thickness between 5 and 50 Angstroms, and preferably from 5 to 10 Angstroms. A second dusting layer may be inserted between the tunnel barrier and a bottom surface of the $Co_R Fe_S Ni_W B_T$ free layer. Moreover, each of the first and second dusting layers may be a laminate comprised of a plurality of dusting layers made of Fe, Co, Ni, or an alloy thereof. The dusting layers may be deposited at room temperature or at an elevated temperature up to 400° C. Subsequently, an anneal up to 400° C. or higher, and preferably 350° C., may be employed to further improve PMA properties and thereby increase Hc and Hk. A dusting layer also improves magnetoresistance (MR ratio) in the MTJ.

In a second embodiment, a non-magnetic metal (M) layer may be inserted within the $Co_R Fe_S Ni_W B_T$ free layer to give a $Co_R Fe_S Ni_W B_T/M/Co_R Fe_S Ni_W B_T$ free layer configuration wherein M is one of Ta, Al, Cu, Zr, or Mg.

In another embodiment, the MTJ element has a top spin valve configuration in a STT-MRAM scheme represented by seed layer/free layer/tunnel barrier/reference layer/cap layer wherein the free layer has a $Co_R Fe_S Ni_W B_T$ or $Co_R Fe_S Ni_W B_T/M/Co_R Fe_S Ni_W B_T$ configuration as described above. Furthermore, a single $Co_R Fe_S Ni_W B_T$ free layer may have a dusting layer adjoining one or both of its top surface and bottom surface in a DL1/$Co_R Fe_S Ni_W B_T$/DL2 scheme where DL1 is a first dusting layer and DL2 is a second dusting layer. Each of DL1 and DL2 may be a laminate comprised of a plurality of dusting layers made of Fe, Co, Ni, or an alloy thereof.

DETAILED DESCRIPTION

The present disclosure is a ferromagnetic layer with high thermal stability and perpendicular magnetic anisotropy that may be employed as a free layer, dipole layer, or reference layer in magnetic devices such as MRAM and STT-MRAM, in spintronic devices such as MAMR, in various designs of PMA spin valves including MTJ elements, and in PMA magnetic media used in magnetic sensors and data storage. The free layer with high thermal stability may be used in devices based on bottom spin valve, top spin valve, or dual spin valve designs as appreciated by those skilled in the art.

In related patent application HMG11-012, we disclosed that dusting layers such as Co or CoFe may be inserted in a ferromagnetic layer comprised of (Ni/Co) laminates or the like, $L1_0$ ordered alloys, or in rare earth-transition metal (RE-TM) films to improve PMA and thermal properties. In this scheme, dusting layers are sandwiched around a coupling layer to improve RKKY coupling in a synthetic antiferromagnetic (SAF) structure. A preferred configuration is RL1/DL1/coupling layer/DL2/RL2 where RL1 and RL2 are reference layers and DL1 and DL2 are dusting layers. Now we have discovered that dusting layers may be used to enhance PMA and thermal stability in other ferromagnetic layers represented by $Co_R Fe_S Ni_W B_T$ where R, S, W, and T are the content of Co, Fe, Ni, and B, respectively, R+S+W+T=100, S>(R+W), and T is in the range of 25 to 40 atomic %. In the prior art, CoFeB free layers with in-plane magnetization generally have a B content of 20 atomic % because they provide a maximum magnetoresistance (MR ratio) caused by good crystalline anisotropy. However, we have found that when optimizing PMA within a CoFeB (or CoFeNiB) layer for spintronic devices, B content is advantageously increased to reduce CoFeB (or CoFeNiB) grain size and decrease the crystalline anisotropy that favors in-plane magnetization. Surprisingly, the MR ratio is only slightly decreased by switching to higher B content while Hc and Hk are enhanced to improve the thermal property (Ku) of the MTJ.

Figure 1:
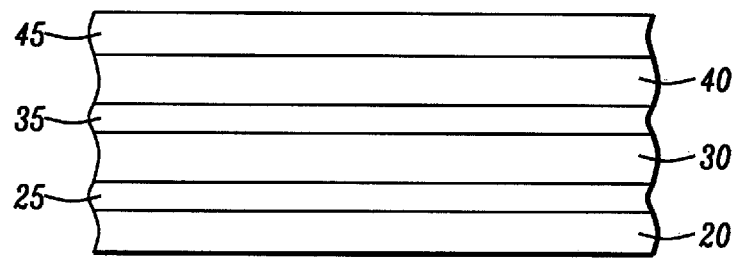
FIG. 1 is a cross-sectional view of a MTJ with a bottom spin valve design with a seed layer/reference layer/tunnel barrier/$Co_R Fe_S Ni_W B_T$ free layer/cap layer configuration according to an embodiment of the present disclosure.

Referring to FIG. 1, a first embodiment of the present disclosure is depicted wherein a seed layer 25, reference layer 30, tunnel barrier 35, free layer 40, and cap layer 45 are sequentially formed on a substrate. All layers in the MTJ comprised of layers 25-45 may be sputter deposited in a sputter deposition mainframe that has at least one oxidation chamber and an etching chamber. In one aspect, the MTJ is part of a MRAM or STT-MRAM structure. In a preferred embodiment, the reference layer 30 has PMA with a fixed magnetization in a direction perpendicular to the plane of the substrate. However, the reference layer may also have in-plane magnetization. The free layer 40 has PMA in a direction perpendicular to the plane of the substrate, and in the preferred embodiment is in a direction parallel or anti-parallel to that of the reference layer to give a 1 or 0 memory state. The substrate may be a bottom electrode in a MRAM, STT-MRAM, or STO, or a bottom shield in a sensor, for example. In a STO device, the reference layer 30 serves as a spin injection layer and free layer 40 functions as a field generation layer. Seed layer 25 maintains or enhances PMA in reference layer 30 and facilitates smooth and uniform crystalline growth in the overlying MTJ layers. The seed layer may be NiCr, Pd, Pt, Ta, Ru or other metals or alloys.

Reference layer 30 may be a laminated structure such as (Co/Ni)n, (Co/Pd)n, (Co/Pt)n, or other laminated stacks exhibiting PMA where n is between 2 and 30, and preferably from 4 to 10. The present disclosure also anticipates that one or more of the laminated layers may be an alloy such as CoFe or CoFeB as a replacement for Co, and NiCo, NiFe, or NiFeB as a replacement for Ni. Thus, (CoFe/Ni)n, (CoFeB/Ni)n, (Co/NiFe)n, (Co/NiFeB)n, and (Co/NiCo)n are alternatives for the reference layer. Typically, each Co or Co alloy layer in the laminates has a thickness between 0.5 and 5 Angstroms while each Pd, Pt, Ni, or Ni alloy layer has a thickness from 2 to 10 Angstroms. Preferably, the Co or Co alloy layer is thinner than the Ni, Ni alloy, Pt, or Pd layer. In another embodiment, reference layer 30 may be comprised of an $L1_0$ ordered alloy such as FePt, CoPt, FePd, NiPt, FeNi, FeCu, MnAl, MnPt, MnPd, CuAu, and the like that have PMA character. In yet another embodiment, the reference layer may be made of a RE-TM film with PMA character including TbFeCo and GdFeCo.

The present disclosure also encompasses an embodiment wherein the reference layer has a synthetic antiferromagnetic (SAF) structure with a coupling layer such as Ru formed between two reference layers RL1 and RL2 with PMA, and between two dusting layers DL1 and DL2 to give a RL1/DL1/coupling layer/DL2/RL2 configuration as previously described in related patent application HMG11-012.

Optionally, a transitional layer (not shown) may be formed as the uppermost layer in a composite reference layer 30. The transitional layer may be comprised of CoFeB, CoFe, or composites thereof, or with Co such as CoFeB/Co, and is beneficial in magnetic device designs where the reference layer is part of a MTJ and interfaces with a tunnel barrier layer made of an oxide. According to one embodiment, the transitional layer is formed between the portion of the reference layer with PMA and a (100) MgO tunnel barrier, for example, and is sufficiently thin to preserve the PMA property of the reference layer 30 and yet thick enough to provide a high magnetoresistance (MR ratio). With regard to CoFeB/Co transitional layer, the CoFeB portion may be from 4 to 8 Angstroms thick, and preferably 6 Angstroms, while the Co layer portion is from 3 to 5 Angstroms, and preferably 4 Angstroms thick. In one aspect, the CoFeB portion of the transitional layer may have a $Co_{20}Fe_{60}B_{20}$ composition. Note that CoFeB/MgO/CoFeB reference layer/tunnel barrier/free layer configurations are known to yield a high MR ratio. However, Co may be used as the uppermost layer in the reference layer stack and the interface with the tunnel barrier layer since it is more resistant to oxidation than a CoFeB (or CoFe) layer. In other words, in a conventional MTJ it is possible for oxygen to migrate out of a MgO tunnel barrier layer into a reference layer thereby causing partial oxidation of CoFeB or the like, which leads to a degradation in the MR ratio.

The tunnel barrier layer 35 may be any oxide layer that induces a spin dependent tunneling effect between the reference layer and free layer. For example, MgO, $Al_2O_3$, TiOx, ZnO, HfOx, or other metal oxides or metal nitrides, or laminations of one or more of the aforementioned materials may be selected as the tunnel barrier in a MTJ with a tunnel magnetoresistance (TMR) configuration.

A key feature is that the free layer 40 is made of at least a $Co_RFe_SNi_WB_T$ layer where R, S, W, and T are the content of Co, Fe, Ni, and B, respectively, R+S+W+T=100, S>(R+W), and T is in the range of 25 to 40 atomic %. Preferably, the Ni, content (W) is from 0 to 2 atomic %. For example, we have found that a $Co_{18}Fe_{50}Ni_2B_{30}$ free layer provides the same high PMA and high thermal stability advantages as a $Co_{20}Fe_{50}B_{30}$ free layer. In one aspect, the free layer is a single layer of $Co_RFe_SNi_WB_T$ having a thickness of from 5 to 20 Angstroms. With thicknesses greater than about 20 Angstroms, the $Co_RFe_SNi_WB_T$ layer tends to have in-plane magnetization. It should be understood that interfacial perpendicular anisotropy is established between oxide and magnetic metal. Thus, when a $Co_RFe_SNi_WB_T$ layer, which normally has in-plane magnetization, adjoins an oxide layer such as MgO, the magnetization of the $Co_RFe_SNi_WB_T$ layer can be aligned out-of-plane under conditions where interfacial perpendicular anisotropy exceeds the shape anisotropy field for the magnetic layer. Note that the thickness of free layer 40 is represented by "d" in equation (5) presented previously. Thus, as the value for "d" is reduced, the perpendicular anisotropy field increases. The shape anisotropy field for a $Co_{20}Fe_{60}B_{20}$ free layer is approximately 12000 Oe. Depending on the composition of a $Co_RFe_SNi_WB_T$ free layer, we have found interfacial perpendicular anisotropy may be greater than 12000 Oe by maintaining thicknesses in the 5 to 20 Angstrom range. Under such conditions, an out-of-plane magnetization (perpendicular anisotropy) is established in the $Co_RFe_SNi_WB_T$ free layer. If the free layer thickness is above about 19-20 Angstroms, then the shape anisotropy field is too large to be overcome by an out-of plane component, and the magnetization of the free layer remains in-plane. In an embodiment wherein the top surface of a $Co_RFe_SNi_WB_T$ free layer contacts a cap layer made of an oxide, then interfacial perpendicular anisotropy is also established at the free layer/cap layer interface which further enhances PMA in free layer 40.

A cap layer 45 is formed on the free layer 40 and may comprised of one or more of Ta, Ru, Cu, Cr, or other metals that induce interfacial perpendicular anisotropy in the adjoining free layer. In another aspect, the cap layer is an oxide of a single element or an oxide of an alloy such as MgTaOx, MgO, SiOx, SrTiOx, BaTiOx, CaTiOx, LaAlOx, MnOx, VOx, $Al_2O_3$, TiOx, BOx, and HfOx, and is preferably MgTaOx where the Mg:Ta ratio is about 1:1. The cap layer may also be a lamination of one or more of the aforementioned oxides. A MgTaOx cap layer is fabricated by first sputter depositing a MgTa layer with a thickness from 2 to 10 Angstroms. Then, either a radical (ROX) oxidation or natural (NOX) oxidation may be employed as a second step. Although a metal oxide cap is preferred over a metal cap in terms of inducing higher PMA in the adjoining free layer, the metal oxide cap does contribute to resistance×area (RA) value for the MTJ which means the thickness of a MgTaOx layer, for example, must be minimized to avoid a higher than desired RA. Moreover, MgTaOx is preferred over MgO for the cap layer since the former contributes a lower RA value than MgO.

Figure 2:
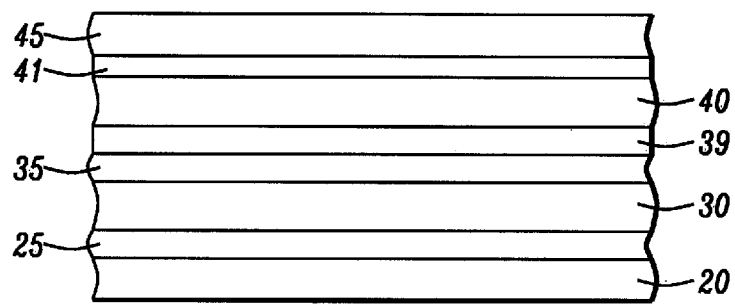
FIG. 2 is a cross-sectional view of the MTJ stack shown in FIG. 1 with a dusting layer adjoining top and bottom surfaces of the $Co_R Fe_S Ni_W B_T$ free layer according to another embodiment of the present disclosure.

According to a second embodiment depicted in FIG. 2, the layers shown in the bottom spin valve configuration of FIG. 1 are retained and a dusting layer (DL) is inserted along top and bottom surfaces of the $Co_RFe_SNi_WB_T$ free layer 40 to give a composite free layer represented by DL1/$Co_RFe_SNi_WB_T$/DL2. Although the present disclosure anticipates only one dusting layer will provide an enhancement in PMA for the free layer, a larger advantage is realized when two dusting layers are employed. However, either DL1 or DL2 layer may be removed from the aforementioned configuration and the spin valve structure will still meet the objectives of the present disclosure as stated previously. Preferably, a first dusting layer (DL1) 39 adjoins the tunnel barrier 35 and contacts a bottom surface of the free layer, and a second dusting layer (DL2) 41 contacts a top surface of the free layer and interfaces with the cap layer 45. Thus, the DL1, $Co_RFe_SNi_WB_T$, and DL2 layers are sequentially laid down on the tunnel barrier prior to forming the cap layer 45. The present disclosure also anticipates that one or both of the DL1 and DL2 layer may be a composite comprising a plurality of dusting layers in a laminated structure.

The dusting layers 39, 41 are made of Co, Fe, or Ni, or alloys thereof such as NiFe, CoFe, CoTa, CoZr, CoHf, CoMg, CoNb, $CoB_V$, or $FeB_V$ where v is from 0 to 40 atomic %. The dusting layers may be deposited at room temperature up to an elevated temperature of at least 400° C. and can be used as deposited or after an additional anneal at 400° C., and preferably about 350° C., once all the MTJ layers are deposited. As a result, Hc and Hk will be increased in the free layer 40. The thickness of each dusting layer in a single DL1 or DL2 layer or in a laminated stack is between 5 and 50 Angstroms, and preferably between 5 and 10 Angstroms. With dusting layer thicknesses greater than about 15 Angstroms, the composite free layer is likely to have in-plane anisotropy rather than PMA. The Ku (anisotropy constant) for the free layer impacts the Eb (energy barrier) of the memory cell and it is believed that inserting dusting layers 39, 41 could also increase the PMA Ku of the free layer thereby increasing Eb and enhancing the retention time of STT-MRAM designs.

Figure 3:
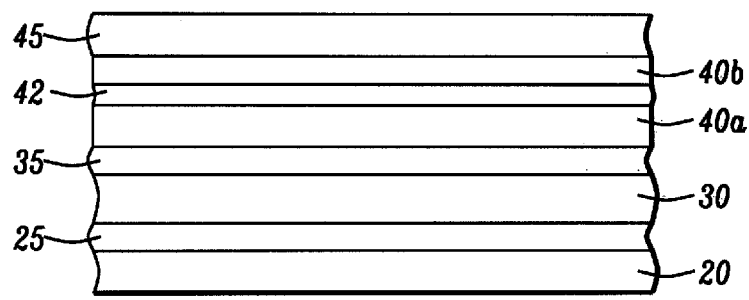
FIG. 3 is a cross-sectional view of the MTJ stack shown in FIG. 1 with a metal insertion layer formed within the $Co_R$-$Fe_S Ni_W B_T$ free layer according to an embodiment of the present disclosure.

Referring to FIG. 3, a third embodiment of the present disclosure is illustrated wherein a non-magnetic metal is inserted in the $Co_RFe_SNi_WB_T$ free layer. As a result, the free layer configuration is now $Co_RFe_SNi_WB_T$/M/$Co_RFe_SNi_WB_T$ where the metal (M) layer 42 is Ta, Al, Cu, Zr, or Mg. The lower $Co_RFe_SNi_WB_T$ layer 40a contacts a top surface of the tunnel barrier 35 and an upper $Co_RFe_SNi_WB_T$ layer 40b interfaces with the cap layer 45. The M layer serves as a moment dilution layer and has a thickness from 5 to 50 Angstroms, and preferably between 5 and 10 Angstroms. In other words, for a fixed free layer thickness, a $Co_RFe_SNi_WB_T$/M/$Co_RFe_SNi_WB_T$ configuration will have less in-plane magnetization than a single $Co_RFe_SNi_WB_T$ free layer. It follows that interfacial perpendicular anisotropy at the interface between the tunnel barrier and lower $Co_RFe_SNi_WB_T$ layer 40a, and at the interface of an oxide cap layer and the upper $Co_RFe_SNi_WB_T$ layer 40b more easily overcomes the shape anisotropy field and generates substantial PMA in the composite free layer. In this embodiment, cap layer 45 is preferably comprised of a metal oxide as previously described, and more preferably is made of MgTaOx in order to enhance the interfacial perpendicular anisotropy at the interface with the $Co_RFe_SNi_WB_T$ layer 40b and generate PMA in the upper portion of the free layer while minimizing RA. Each of the $Co_RFe_SNi_WB_T$ layers 40a, 40b has a thickness from 5 to 14 Angstroms. Furthermore, dusting layers DL1 and/or DL2 may be formed along bottom and top surfaces, respectively, of the free layer to afford a DL1/$Co_RFe_SNi_WB_T$/M/$Co_RFe_SNi_WB_T$, $Co_RFe_SNi_WB_T$/M/$Co_RFe_SNi_WB_T$/DL2, or DL1/$Co_RFe_SNi_WB_T$/M/$Co_RFe_SNi_WB_T$/DL2 configuration. Each of the dusting layers has a thickness from 2 to 10 Angstroms. In another aspect, one or both of the DL1 and DL2 layers may be a composite with a plurality of dusting layers formed in a laminated structure.

Figure 4:
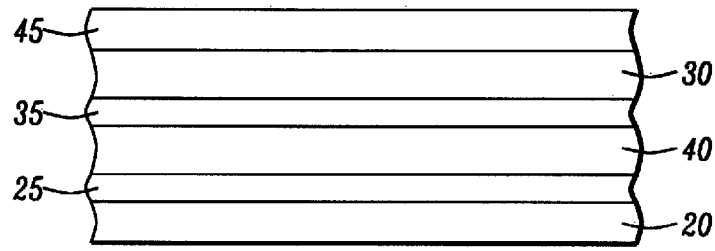
FIG. 4 is a cross-sectional view of a MTJ with a top spin valve design and a seed layer/$Co_R Fe_S Ni_W B_T$ free layer/tunnel barrier/reference layer/cap layer configuration according to an embodiment of the present disclosure.

Referring to FIG. 4, the present disclosure also encompasses an embodiment with a top spin valve design wherein free layer 40, tunnel barrier 35, reference layer 30, and cap layer 45 are consecutively formed on seed layer 25. The free layer 40 may be a single $Co_RFe_SNi_WB_T$ layer, or have a $DL1/Co_RFe_SNi_WB_T/DL2$ or $DL1/Co_RFe_SNi_WB_T/M/Co_RFe_SNi_WB_T/DL2$ configuration where DL1 and DL2 are dusting layers contacting top and bottom surfaces, respectively of a $Co_RFe_SNi_WB_T$ portion of the composite free layer. Thus, the DL1, a single $Co_RFe_SNi_WB_T$ or composite $Co_RFe_SNi_WB_T/M/Co_RFe_SNi_WB_T$ free layer, and DL2 layers are sequentially deposited on the seed layer prior to forming the tunnel barrier on the free layer. Note that one or both of the DL1 and DL2 layers may be a laminated structure with a plurality of dusting layers.

Once all of the layers in the multilayer stack and MTJ are formed, an annealing process may be performed that is comprised of a temperature between 200° C. and 500° C., and preferably between 300° C. and 400° C., for a period of 1 minute to 10 hours. Thereafter, the MTJ stack may be patterned to form a plurality of MRAM (or STT-MRAM) memory cells or STO elements by a well known photolithography and etch sequence on the substrate 20. In an embodiment where the substrate is a bottom electrode, the bottom electrode may be patterned simultaneously with the overlying multilayer stack to enable a higher density of patterned structures for advanced technology designs.

Example 1

Figure 5:
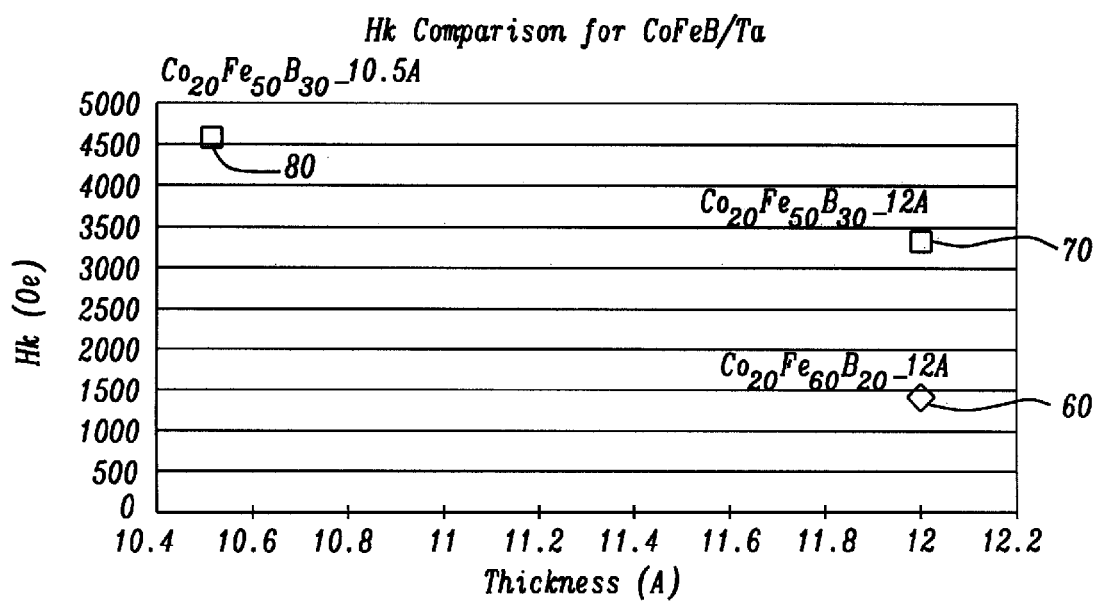
FIG. 5 shows the Hk (anisotropy field) comparison between a conventional $Co_{20}Fe_{60}B_{20}$ free layer and a $Co_{20}Fe_{60}B_{30}$ free layer of the present disclosure.

To demonstrate the benefits of a $Co_RFe_SNi_WB_T$ layer according to the present disclosure, unpatterned partial MTJ stacks were fabricated and the Hk anisotropy field for each was measured with a vibrating sample magnetometer (VSM). Each of the partial stacks has a lower MgO layer, a middle CoFeB layer, and an upper Ta cap layer. In sample A representing a conventional free layer, the $Co_{20}Fe_{60}B_{20}$ layer is 12 Angstroms thick. Samples B and C relate to $Co_{20}Fe_{50}B_{30}$ layers according to the present disclosure and have thicknesses of 12 Angstroms, and 10.5 Angstroms, respectively. All structures were deposited at room temperature and annealed at 300° C. for 1 hour. As shown in FIG. 5, Hk of $Co_{20}Fe_{60}B_{20}$ is ~1500 Oe (point 60), and Hk of $Co_{20}Fe_{50}B_{30}$ (B & C samples) is ~3300 for the thicker film (point 70) and ~4600 for the thinner film (point 80). These results prove that PMA of a free layer can be dramatically increased by replacing the conventional $Co_{20}Fe_{60}B_{20}$ material with $Co_RFe_SNi_WB_T$ wherein the B content is from 25 to 40 atomic %, W is 0 to 2 atomic %, and the alloy is Fe rich (S>R+W).

Example 2

Figure 6:
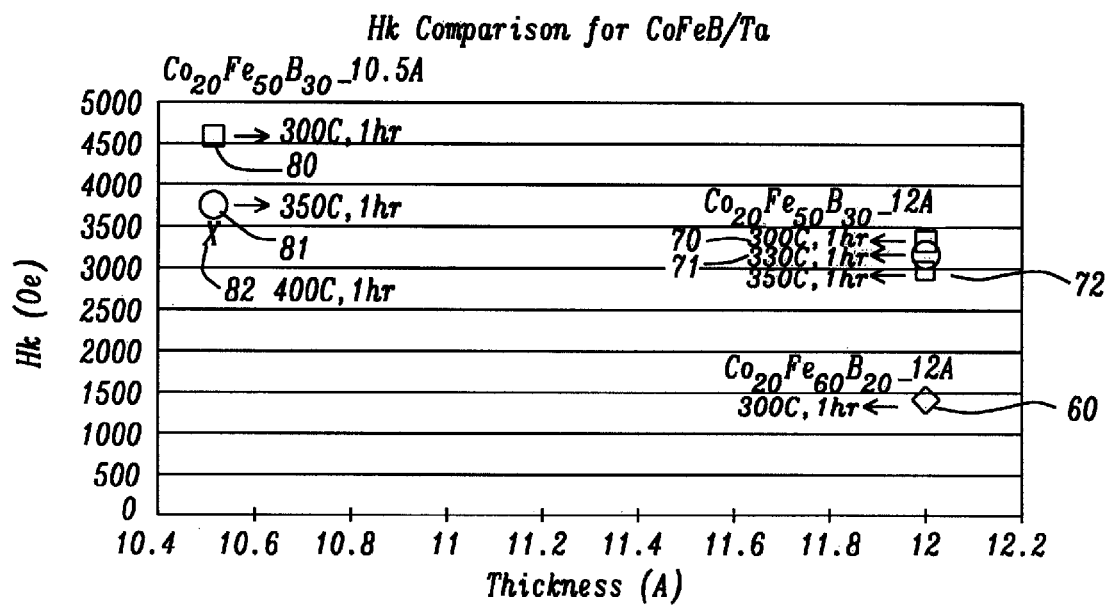
FIG. 6 shows the effect of annealing temperature on Hk for various $Co_{20}Fe_{60}B_{20}$ and $Co_{20}Fe_{60}B_{30}$ free layer structures.

A second experiment was performed to show that the B and C samples described above maintain a significant Hk value even after further annealing at 350° C. for 1 hour and even up to 400° C. for 1 hour. On the other hand, we found that the $Co_{20}Fe_{60}B_{20}$ layer (sample A above) completely lost Hk after further annealing at 350° C. for 1 hour. Note that for a 12 Angstrom thick $Co_{20}Fe_{50}B_{30}$ layer, Hk decreases to ~3200 Oe (point 71) after an additional hour of annealing at 330° C., and Hk is lowered to about ~3000 Oe (point 72) following an additional hour of annealing at 350° C. as illustrated in FIG. 6. Meanwhile, for the 10.5 Angstrom thick $Co_{20}Fe_{50}B_{30}$ layer, there is a reduction in Hk to about 3750 Oe after further annealing at 350° C. for 1 hour as indicated by data point 81. Even after 1 hour annealing at 400° C. (point 82), a substantial Hk=3500 Oe is maintained.

Example 3

To further illustrate the benefits of the present disclosure, a circular MTJ device (50 nm diameter) suitable for advanced spin torque MRAM applications was fabricated on a Si/SiO$_2$ substrate with a seed layer/reference layer/MgO tunnel barrier/free layer/cap layer configuration. In this example, the seed layer is a 50 Angstrom thick NiCr layer and the composite reference layer has a $(Ni/Co)_{10}/Co4/Ru4/Co4/(Ni/Co)_8/CoFeB6/Co4$ composition wherein two Co dusting layers are sandwiched around a Ru coupling layer in a RL1/DL1/Ru/DL2/RL2 scheme where RL1 and RL2 are $(Co/Ni)_n$ laminates in which each Ni layer is 6 Angstroms thick and each Co layer is 2.5 Angstroms thick. There is also a CoFeB6/Co4 transitional layer formed as the uppermost layer in the composite reference layer. Note that the number following each of the Co, Ru, and CoFeB layers is the thickness of the layer. The MgO tunnel barrier was prepared by depositing an 8 Angstrom thick Mg layer followed by a radical oxidation (ROX) and then deposition of a 4 Angstrom thick Mg layer. The cap layer is a 50 Angstrom thick film of Ta. In this coercivity (Hc) study, three different free layer materials were employed including a conventional 14 Angstrom thick film of $Co_{20}Fe_{60}B_{20}$, a 14 Angstrom thick film of $Co_{20}Fe_{50}B_{30}$, and a composite free layer having a $Co_{20}Fe_{50}B_{30}/Fe$ configuration in which the CoFeB layer is 8 Angstroms thick and the overlying Fe dusting layer is 4 Angstroms thick. It is believed that the Hc value in this small device will be proportional to the anisotropy field as long as the free layers have similar Ms values.

Figure 7:
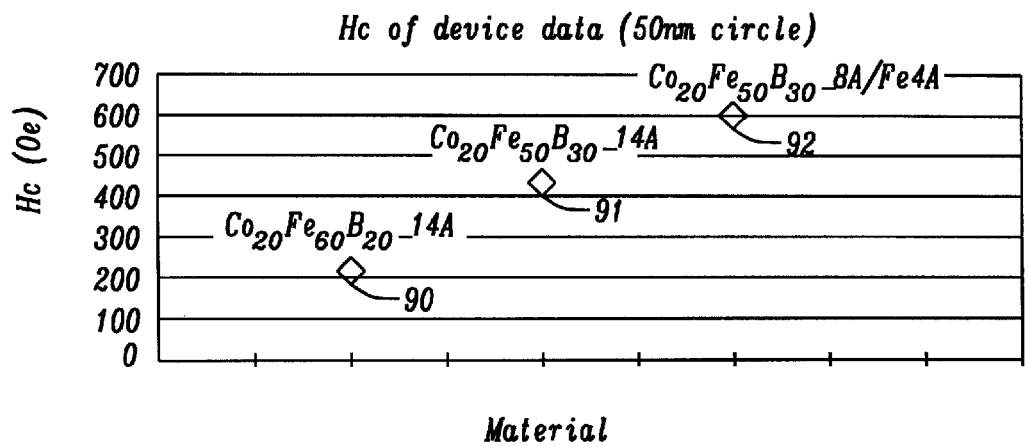
FIG. 7 illustrates a coercivity (Hc) comparison of $Co_{20}Fe_{60}B_{20}$, $Co_{20}Fe_{50}B_{30}$, and $Co_{20}Fe_{60}B_{30}$/Fe free layers in an actual MTJ device.

As illustrated in FIG. 7, we observe the Hc of the device increases from 200 Oe (point 90) to 400 Oe (point 91) as the $Co_{20}Fe_{60}B_{20}$ free layer is replaced by a $Co_{20}Fe_{50}B_{30}$ layer. Data points are shown after a 1 hour anneal at 300° C. This result is consistent with anisotropy field measurements taken on blanket films discussed previously with respect to FIG. 5. The Hc of the small device can be increased further to 600 Oe (point 92) by inserting a Fe dusting layer between the $Co_{20}Fe_{50}B_{30}$ free layer and Ta cap layer. When the annealing temperature is raised to 400° C. for 1 hour, Hc goes to 0 for the $Co_{20}Fe_{60}B_{20}$ reference. On the other hand, Hc remains about the same for the $Co_{20}Fe_{50}B_{30}$ layer after 1 hour at 350° C. and increases to about 600 Oe after 1 hour at 400° C. Meanwhile, Hc for the $Co_{20}Fe_{50}B_{30}/Fe$ layer is reduced to about 300 Oe after 1 hour at 400° C. but still maintains a substantial value. Clearly, the increased B content in a $Co_RFe_SNi_WB_T$ layer as defined herein accounts for a dramatic improvement in Hc (after high temperature annealing up to at least 400° C.) from a value of zero for a conventional $Co_{20}Fe_{60}B_{20}$ free layer to a range of 300 to 600 Oe for a $Co_{20}Fe_{50}B_{30}/Fe$ layer or $Co_{20}Fe_{50}B_{30}$ layer formed according to an embodiment of the present disclosure. Obviously, the free layers as disclosed herein with withstand process temperatures above 400° C. in view of the fact that considerable Hc (perpendicular magnetic anisotropy) is maintained even up to 400° C. as demonstrated by our experimental results in FIGS. 6-7.

The benefits of the present disclosure are an improved PMA (Hc and Hk) for a $Co_RFe_SNi_WB_T$ free layer in a magnetic device with increased Ku that will increase the retention time for a memory cell. Moreover, at least one dusting layer may be added to one or both of top and bottom surfaces of the free layer to improve MR ratio and PMA. A non-magnetic moment dilution layer may be inserted within the free layer to improve PMA. There is also improved compatibility with high temperature processing above 350° C. up to at least 400° C. that makes the MTJ stacks described herein suitable for a variety of applications including advanced STT-MRAM devices. The processes and materials described herein are compatible with the design and processing requirements of magnetic devices.

While this disclosure has been particularly shown and described with reference to, the preferred embodiment thereof, it will be understood by those skilled in the art that various changes in form and details may be made without departing from the spirit and scope of this disclosure.

We claim:

1. A multilayer stack in a magnetic device, comprising:
   (a) a reference layer;
   (b) a free layer containing at least a layer with a $Co_R Fe_S Ni_W B_T$ composition wherein R, S, W, and T are the content of Co, Fe, Ni, and B respectively, R+S+W+T=100, S>(R+W), W is greater than 0 but less than or equal to 2 atomic %, and T is from about 25 to 40 atomic %, and two dusting layers made of Co, Fe, Ni, or alloys thereof that are selected from CoFe, CoTa, CoZr, CoHf, CoMg, CoNb, $CoB_V$ or $FeB_V$ where v is from 0 to 40 atomic %, a first dusting layer (DL1) contacts a bottom surface of the $Co_R Fe_S Ni_W B_T$ layer and a second dusting layer (DL2) contacts a top surface of the $Co_R Fe_S Ni_W B_T$ layer to give a DL1/$Co_R Fe_S Ni_W B_T$/DL2 free layer configuration, the free layer maintains perpendicular magnetic anisotropy (PMA) after thermal treatment to above 400° C.; and
   (c) a tunnel barrier layer formed between the reference layer and free layer.

2. The multilayer stack of claim 1 wherein the layer with a $Co_R Fe_S Ni_W B_T$ composition has a thickness from about 5 to 20 Angstroms.

3. The multilayer stack of claim 1 wherein each of the first and second dusting layers has a thickness from about 5 to 15 Angstroms.

4. The multilayer stack of claim 3 wherein one or both of the first and second dusting layers is a composite comprising a laminated structure of dusting layers.

5. The multilayer stack of claim 3 further comprised of a seed layer and a cap layer wherein the seed layer, first dusting layer, $Co_R Fe_S Ni_W B_T$ layer, second dusting layer, tunnel barrier layer, reference layer, and cap layer are sequentially formed on a substrate to form a top spin valve structure.

6. The multilayer stack of claim 1 further comprised of a cap layer as an uppermost layer in the multilayer stack, the cap layer is a metal layer or a metal oxide layer that contacts a top surface of the free layer in a bottom spin valve configuration and thereby induces or enhances PMA in the free layer.

7. The multilayer stack of claim 1 wherein the reference layer exhibits PMA, a magnetization direction thereof is parallel or anti-parallel to the PMA in the free layer to establish either a 1 or 0 memory state in the magnetic device.

8. A magnetic device including a stack of layers, comprising:
   (a) a reference layer with perpendicular magnetic anisotropy (PMA);
   (b) a composite free layer with a $Co_R Fe_S Ni_W B_T$/M/$Co_R Fe_S Ni_W B_T$ structure wherein R, S, W, and T are the content of Co, Fe, Ni, and B respectively, R+S+W+T=100, S>(R+W), T is from about 25 to 40 atomic %, and M is a non-magnetic metal layer that is one of Cu, Al, Zr, or Mg, and further comprised of two dusting layers made of Co, Fe, Ni, or alloys thereof that are selected from NiFe, CoFe, CoTa, CoZr, CoHf, CoMg, CoNb, $CoB_V$, or $FeB_V$ where v is from 0 to 40 atomic %, a first dusting layer (DL1) contacts a bottom surface of the $Co_R Fe_S Ni_W B_T$/M/$Co_R Fe_S Ni_W B_T$ structure, and a second dusting layer (DL2) contacts a top surface of the $Co_R Fe_S Ni_W B_T$/M/$Co_R Fe_S Ni_W B_T$ structure to give a DL1/$Co_R Fe_S Ni_W B_T$/M/$Co_R Fe_S Ni_W B_T$/DL2 composite free layer configuration wherein each of the $Co_R Fe_S Ni_W B_T$ layers has perpendicular magnetic anisotropy; and
   (c) a tunnel barrier layer formed between the reference layer and composite free layer.

9. The magnetic device of claim 8 wherein the stack of layers further comprises a seed layer formed on a substrate and a cap layer, the stack of layers has a bottom spin valve structure in which the seed layer, reference layer, tunnel barrier, composite free layer, and cap layer are sequentially formed on the substrate, and the cap layer is made of a metal oxide.

10. The magnetic device of claim 9 wherein the metal oxide cap layer is one of MgTaOx, MgO, SiOx, SrTiOx, BaTiOx, CaTiOx, LaAlOx, MnOx, VOx, $Al_2O_3$, TiOx, BOx, and HfOx, or a lamination of one or more of the aforementioned oxides.

11. The magnetic device of claim 8 wherein the metal (M) layer has a thickness between about 5 and 10 Angstroms.

12. The magnetic device of claim 8 wherein each of the $Co_R Fe_S Ni_W B_T$ layers has a thickness between about 5 and 14 Angstroms.

13. The magnetic device of claim 8 wherein the composite free layer has a thickness from about 15 to 38 Angstroms.

14. The magnetic device of claim 8 wherein the first and second dusting layers each have a thickness from about 2 to 10 Angstroms.

15. The magnetic device of claim 8 wherein the reference layer exhibits PMA, a magnetization direction thereof is parallel or anti-parallel to the PMA in the composite free layer to establish either a 1 or 0 memory state in the magnetic device.

16. The magnetic device of claim 8 further comprised of a seed layer and a cap layer wherein the seed layer, the DL1/$Co_R Fe_S Ni_W B_T$/M/$Co_R Fe_S Ni_W B_T$/DL2 composite free layer, tunnel barrier layer, reference layer, and cap layer are sequentially formed on a substrate to give a top spin valve structure.

17. A magnetic device including a stack of layers, comprising:
   (a) a seed layer formed on a substrate;
   (b) a reference layer with perpendicular magnetic anisotropy (PMA);
   (c) a composite free layer with a $Co_R Fe_S Ni_W B_T$/M/$Co_R Fe_S Ni_W B_T$ configuration wherein each of the $Co_R Fe_S Ni_W B_T$ layers has PMA, R, S, W, and T are the content of Co, Fe, Ni, and B respectively, R+S+W+T=100, S>R, W is from 0 to about 2 atomic %, T is from about 25 to 40 atomic %, and M is a non-magnetic metal layer that is one of Cu, or Al;
   (d) a tunnel barrier layer formed between the reference layer and composite free layer; and
   (e) a cap layer as the uppermost layer in the stack of layers.

18. The magnetic device of claim 17 wherein the stack of layers is a bottom spin valve structure in which the seed layer, reference layer, tunnel barrier, composite free layer, and cap layer are sequentially formed on the substrate, and the cap layer is made of a metal oxide.

19. The magnetic device of claim 18 wherein the metal oxide cap layer is one of MgTaOx, MgO, SiOx, SrTiOx, BaTiOx, CaTiOx, LaAlOx, MnOx, VOx, $Al_2O_3$, TiOx, BOx, and HfOx, or a laminate of one or more of the aforementioned oxides.

20. The magnetic device of claim 17 wherein the metal (M) layer has a thickness between about 5 and 10 Angstroms.

21. The magnetic device of claim 17 wherein each of the $Co_R Fe_S Ni_W B_T$ layers has a thickness between about 5 and 14 Angstroms.

22. A magnetic device including a stack of layers, comprising:
- (a) a seed layer formed on a substrate;
- (b) a reference layer with perpendicular magnetic anisotropy (PMA);
- (c) a composite free layer with a $Co_R Fe_S Ni_W B_T/M/Co_R Fe_S Ni_W B_T$ configuration wherein each of the $Co_R Fe_S Ni_W B_T$ layers has PMA, R, S, W, and T are the content of Co, Fe, Ni, and B respectively, R+S+W+T=100, S>R, W is from 0 to about 2 atomic %, T is from about 25 to 40 atomic %, and M is a non-magnetic metal layer that is one of Cu, Al, Zr, or Mg;
- (d) a tunnel barrier layer formed between the reference layer and composite free layer; and
- (e) a MgTaOx cap layer as the uppermost layer in the stack of layers.

* * * * *